(12) United States Patent
Lee et al.

(10) Patent No.: US 6,277,760 B1
(45) Date of Patent: Aug. 21, 2001

(54) METHOD FOR FABRICATING FERROELECTRIC CAPACITOR

(75) Inventors: Heon-Min Lee, Kyonggi-do; Hyo-Jin Nam, Taejon-Kwangyokshi; Dong-Chun Kim, Kyonggi-do, all of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/339,211

(22) Filed: Jun. 24, 1999

(30) Foreign Application Priority Data

Jun. 26, 1998 (KR) .................................. 98-24418
Sep. 18, 1998 (KR) .................................. 98-38742

(51) Int. Cl.[7] .................................. H01L 21/302
(52) U.S. Cl. .................... 438/706; 710/720; 710/722
(58) Field of Search ...................... 438/706, 710, 438/720, 722

(56) References Cited

U.S. PATENT DOCUMENTS 5,254,217 * 10/1993 Maniar et al. ..................... 438/608
5,443,688 * 8/1995 Toure et al. ........................... 438/3
5,555,486 * 9/1996 Kingon et al. ...................... 361/305
5,658,820 * 8/1997 Chung ..................................... 438/3
5,840,200 * 11/1998 Nakagawa et al. ..................... 216/6

FOREIGN PATENT DOCUMENTS

795896 A2 * 9/1997 (GB) .......................... H01L/21/311

* cited by examiner

*Primary Examiner*—Benjamin L. Utech
*Assistant Examiner*—Lynette T. Umez-Eronini
(74) *Attorney, Agent, or Firm*—Fleshner & Kim, LLP

(57) ABSTRACT

Method for fabricating a ferroelectric capacitor, including the steps of (1) foxing an etch stopper formed of any one of $TiO_2$ and $RuO_2$ a lower electrode, a ferroelectric layer, an upper electrode, and an etch mask layer formed of any one of Ti, Ru and Cr in succession on a substrate, (2) patterning the etch mask layer to a required form, (3) using the etch mask layer as a mask in etching the upper electrode, the ferroelectric layer, and the lower electrode at a time, to expose the etch stopper, and (4) removing the etch stopper and the etch mask layer, whereby allowing a simple and easy fabrication of the capacitor regardless of presence of steps.

14 Claims, 7 Drawing Sheets

METHOD FOR FABRICATING FERROELECTRIC CAPACITOR

BACKGROUND OF THE INVENTION

1. Field of the Invention

The present invention relates to a method for fabricating a ferroelectric memory.

2. Background of the Related Art

Currently, there have been wide researches for application of a P(L)ZT or SBT thin film to a memory, such as an FRAM (Ferroelectric Random Access Memory). As a high temperature and an oxygen environment are involved in forming the PZT thin film, metals such as Pt, or oxides such as $RuO_2$ or $IrO_2$, which are stable in an oxygen environment, are widely used as an electrode material. In the fabrication of the FRAM, technologies for forming and etching the electrode and the ferroelectric film are essential. Though there has been researches for dry etching of the PZT thin film or the Pt thin film partly, there have been difficulties in formation of the capacitor for use in the FRAM because present technologies have a low etch rate, a poor etch selectivity to photoresist, and a fence formed at sidewall after an etching. Though there have been researches for fabricating the capacitor using $SiO_2$ as a mask material for assuring an etch selectivity partly, the assurance of an adequate etch selectivity for fabricating the capacitor for FRAM has been failed(etch selectivity of the Pt film to the $SiO_2$ is ≈1). Therefore, researches for an appropriate etch mask which can suppress formation of a fence after etching and has an excellent etch selectivity are required.

FIG. 1 illustrates a typical PRAM, which can be fabricated by a process for fabricating a transistor using a CMOS process and a process for fabricating a ferroelectric capacitor. However, as shown in FIG. 2, unless CMP(Chemical Mechanical Polishing) is used in fabrication of the transistor using the CMOS process, a great step is formed by a field oxide and a polysilicon. In general, coating of the PZT thin film by sol-gel method is done in spin coating. The spin coating causes a thin film thicker in a grooved portion and thinner in a ridged portion, which causes the following problems when the thin film is etched.

Even after completion of etching the thinner portion of the PZT thin film, a thick PZT film still remains at the thicker portion of the PZT thin film. And, if the film remained at the thicker portion of the PZT thin film is etched, BPSG(Boron Phosphorus Silicate Glass) and an underlying electrode at the thinner portion of the PZT thin film will be also etched seriously. In general, as the BPSG is etched faster than the PZT thin film in a $Cl_2/CF_4$ gas environment which is used in etching the PZT thin film, a problem of an excessive etching of the BPSG becomes more serious. Moreover, since a high density device packing leads an etch rate of a groove portion slower than a ridge portion, the problem becomes more serious. For solving the problem, a CMP can be applied before fabrication of the capacitor of the PZT for planarizing the steps after deposition of the BPSG but the CMP costs high and has not established process conditions which are enough for application to a mass production, yet.

SUMMARY OF THE INVENTION

Accordingly, the present invention is directed to a method for fabricating a ferroelectric capacitor that substantially obviates one or more of the problems due to limitations and disadvantages of the related art.

An object of the present invention is to provide a method for fabricating a ferroelectric capacitor, which has an excellent etch selectivity and can prevent formation of a fence.

Other object of the present invention is to provide a method for fabricating a ferroelectric capacitor, which allows a stable formation of a capacitor regardless of presence of a step.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages in accordance with the purpose of the present invention, as embodied and broadly described, the method for fabricating a ferroelectric capacitor includes the steps of (1) forming an etch stopper a lower electrode, a ferroelectric layer, an upper electrode, and a mask layer in succession on a substrate, (2) patterning the etch mask layer to a required form, (3) using the mask layer as a mask in etching the upper electrode, the ferroelectric layer, and the lower electrode at a time, to expose the etch stopper, and (4) removing the etch stopper and the etch mask layer.

The etch stopper is formed of any one selected from $TiO_2$ and $RuO_2$ and the mask layer is formed of any one selected from Ti, Ru and Cr.

The etching in the step (3) is conducted in a $Cl_2/O_2$ gas environment, or a $Cl_2$, a $Cl_2/CF_4$, and a $Cl_2$ gas environments in a sequence in etching the upper electrode, the ferroelectric layer, and the lower electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. The present invention shows fabrication of a ferroelectric capacitor by en bloc etching of an upper electrode/a ferroelectric layer/a lower electrode and en bloc etching of the upper electrode and the ferroelectric layer FIGS. 3A~3E illustrate sections showing the steps of a method for fabricating a ferroelectric capacitor in accordance with a first preferred embodiment of the present invention.

Figure 1:
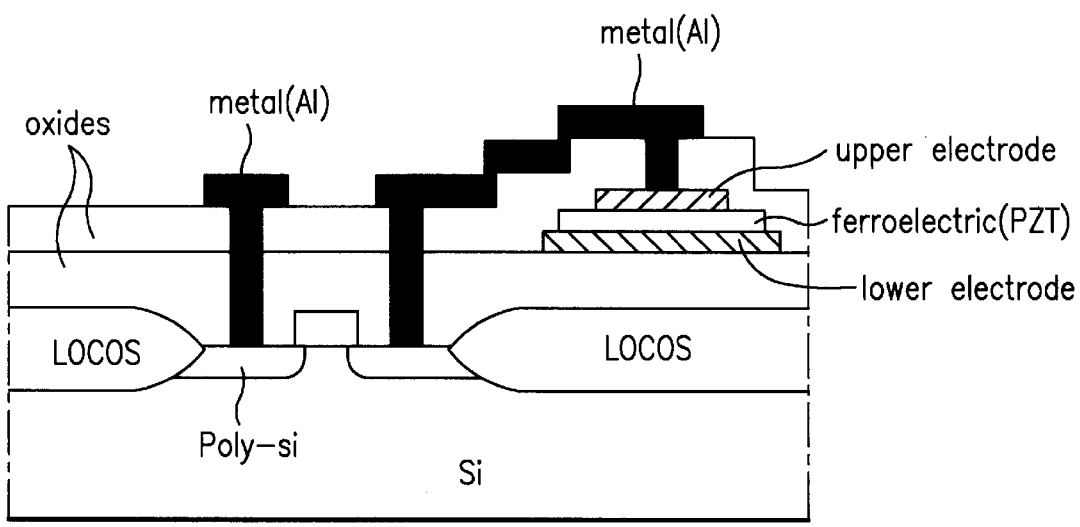
FIG. 1 illustrates a related art Fe-RAM.
Figure 2:
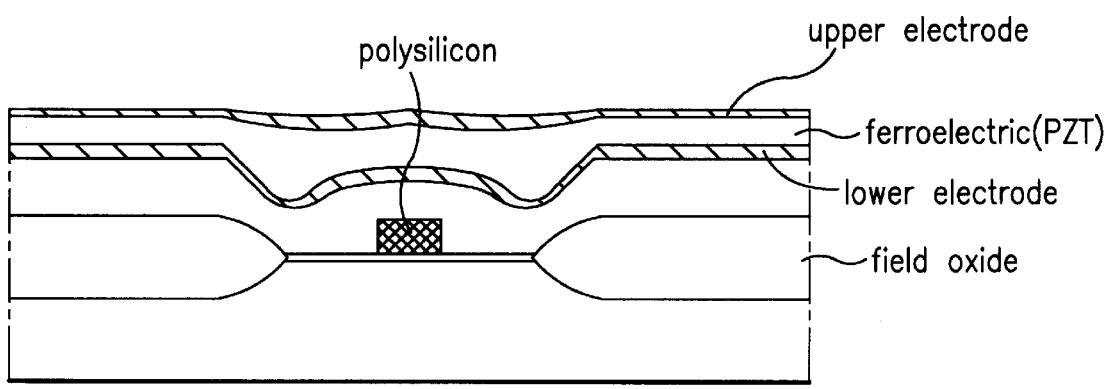
FIG. 2 illustrates a ferroelectric capacitor formed in a region with steps.
Figure 3A:
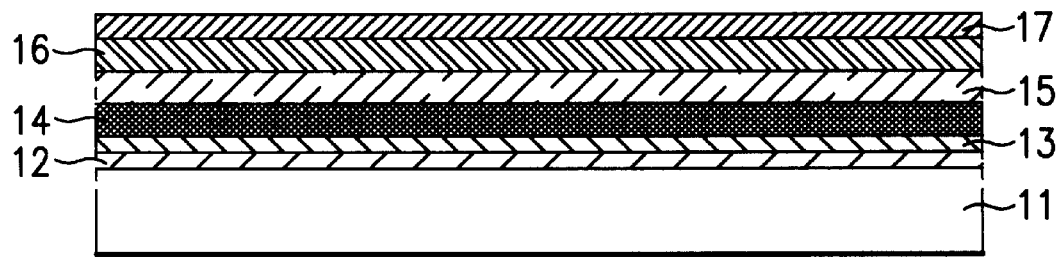
FIGS. 3A~3E illustrate sections showing the steps of a method for fabricating a ferroelectric capacitor in accordance with a first preferred embodiment of the present invention.
Figure 3B:
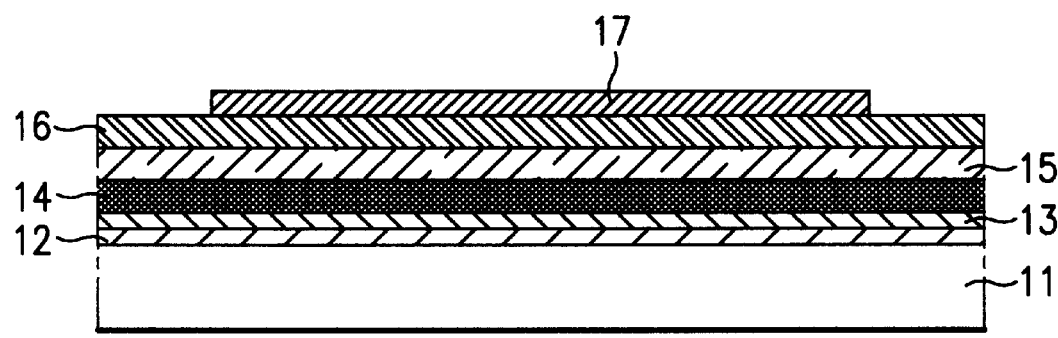
Figure 3C:
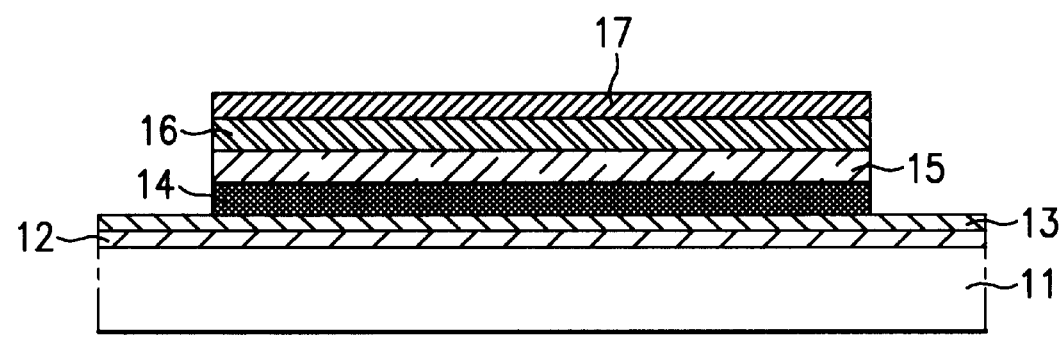
Figure 3D:
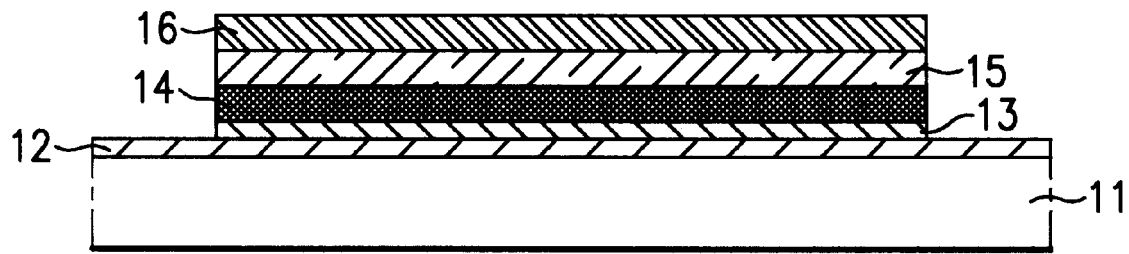
Figure 3E:
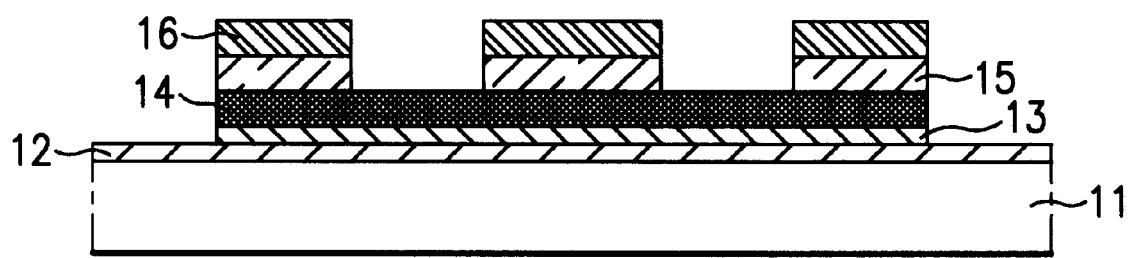

Referring to FIG. 3A, the method starts with forming a silicon oxide film 12, an etch stopper 13, a lower electrode 14, a ferroelectric layer 15, an upper layer 16, and a mask layer 17 on the substrate 11 in succession. The etch stopper 13 has a thickness determined taken a thickness to be etched into consideration. The etch stopper 13 is formed of $TiO_2$, and the mask layer 17 is formed of Ti. The reason why the etch stopper is formed of $TiO_2$ and the mask layer is formed of Ti will be explained later. Then, as shown in FIG. 3B, the mask layer 17 is patterned to a required shape by photolithography. A photoresist used is AZ1512, a soft baking is conducted at approx. 90° C. for about 90 sec., a hard baking after development is conducted at approx. 110° C. for approx. 3 min. in a hot plate oven. As shown in FIG. 3C, the upper electrode 16, the ferroelectric layer 15 and the lower electrode 14 are subjected to en bloc etching, to expose the etch stopper 13 using an ICP(Inductively Coupled Plasma) etcher in a $Cl_2/O_2$ gas environment. As shown in FIG. 3D, the exposed etch stopper 13 and the mask 17 is removed. The etch stopper 13 is removed by ICP etcher, and the mask layer 17 is removed by $SC1(H_2O_2:NH_4OH:H_2O=1:1:5)$. And, as shown in FIG. 3E, alike the en bloc etching of the upper electrode 16, the ferroelectric layer 15 and the lower electrode 14, a region of each of the upper electrode 16 and the ferroelectric layer 15 is subjected to en bloc etching using a Ti mask, thereby completing fabrication of the ferroelectric capacitor. The method for fabricating a ferroelectric capacitor in accordance with the first embodiment of the present invention has a simple and easy fabrication process even if there are structural steps present under the capacitor, because etch rates of the $TiO_2$ and Ti used as the etch stopper and the mask layer, respectively are very low in the $Cl_2/O_2$ gas environment in etching the upper electrode/ferroelectric layer/the lower electrode or the upper electrode/the ferroelectric layer in the $Cl_2/O_2$ gas environment as shown in TABLE 1 below.

TABLE 1

| etching conditions (IPC) | | | | | | |
|---|---|---|---|---|---|---|
| $Cl_2/O_2$ gas flow (sccm) | RIE power (W)/ICP power (W)/pressure (mTorr) | etch rates (Å/min) | | | | selectivity (Pt/PZT/Ti, Pt/$TiO_2$) |
| | | Pt | PZT | Ti | $TiO_2$ | |
| 20/30 | 150/700/10 | 154 | | 11 | | 14 |
| 20/30 | 300/700/10 | 380 | | 60 | | 6.3 |
| 20/30 | 150/700/10 | | 27 | 11 | | 2.5 |
| 20/30 | 300/700/10 | | 232 | 60 | | 3.9 |
| 20/30 | 150/700/10 | 154 | | | ≈5 | ≈30.8 |
| 20/30 | 300/700/10 | 380 | | | ≈5 | ≈76 |

As shown in TABLE 1, it can be known that $TiO_2$ and Ti have low etch rates in the $Cl_2/O_2$ gas environment, implying a possibility that $TiO_2$ and Ti can be used as a etch stopper or a mask layer in the $Cl_2/O_2$ gas environment.

FIGS. 4A~4F illustrate sections showing the steps of a method for fabricating a ferroelectric capacitor in accordance with a second preferred embodiment of the present invention.

Figure 4A:
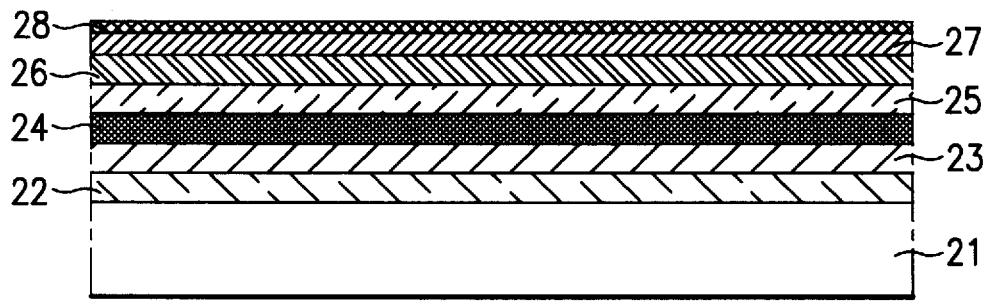
FIGS. 4A~4F illustrate sections showing the steps of a method for fabricating a ferroelectric capacitor in accordance with a second preferred embodiment of the present invention.
Figure 4B:
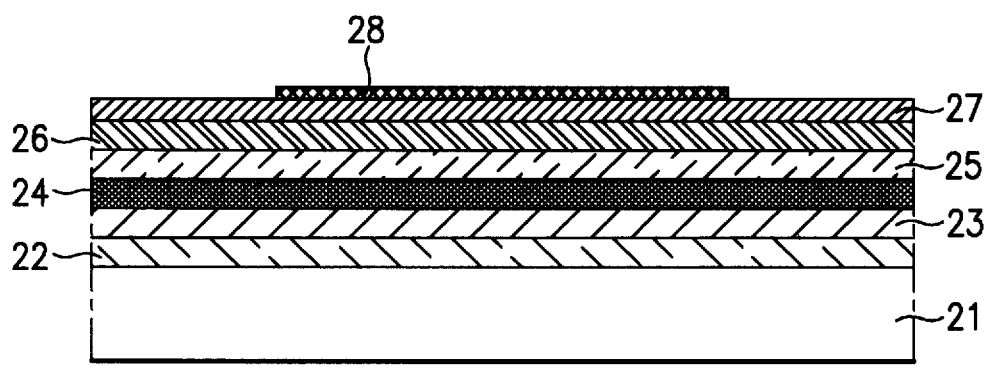
Figure 4C:
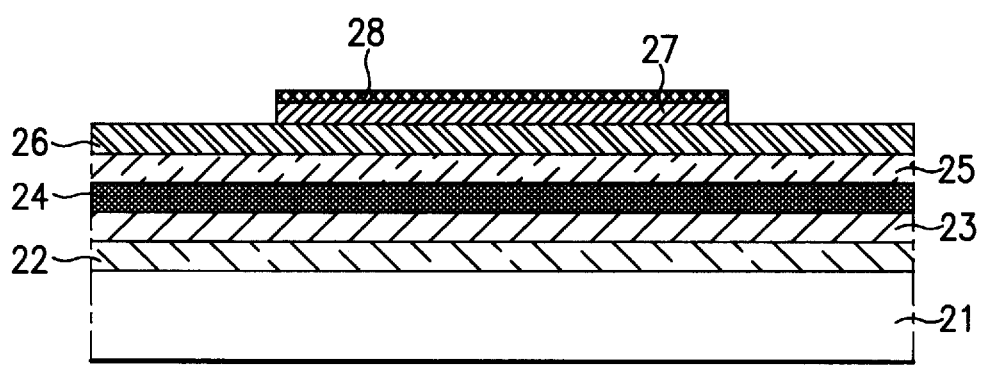
Figure 4D:
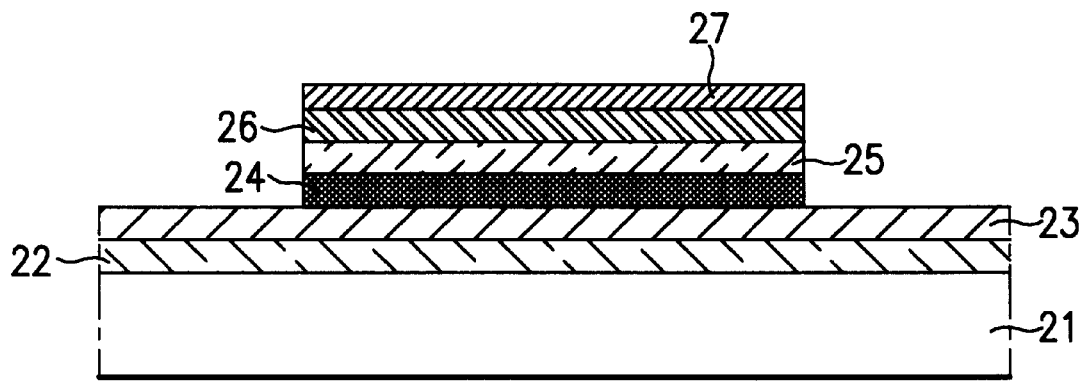
Figure 4E:
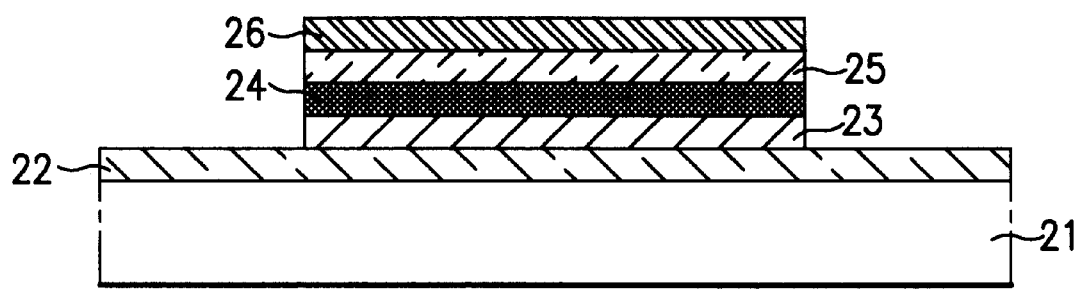
Figure 4F:
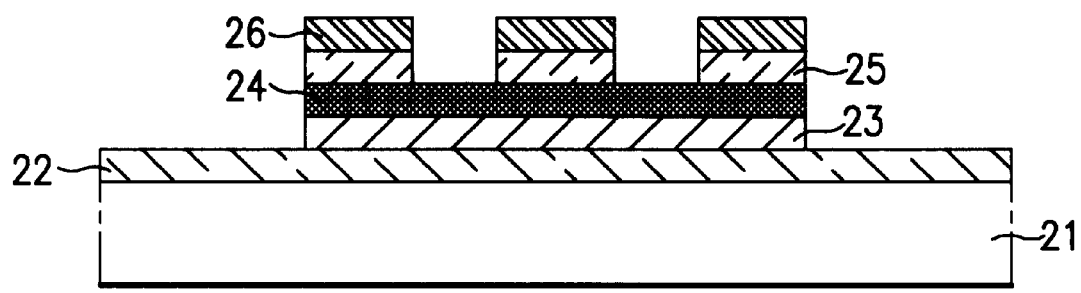

Referring to FIG. 4A, the method starts with forming a silicon oxide film 22, a RuO2 etch stopper 23, Pt/Ti lower electrode 24, a PZF- feitoelectric layer 25, a Pt upper electrode 26, Ru or Cr mask layer 27, and a Ti layer 28, on a substrate 21 in succession. A thickness of each of the mask layer 27 and the etch stopper 23 is determined taking a thickness of film to be etched. Then, as shown in FIG. 4B, the Ti layer 28 is patterned to a required form in a $Cl_2/N_2$ gas environment by photolithography. And, as shown in FIG. 4C, the patterned Ti layer 28 is used as a mask in patterning the mask layer 27 in a $Cl_2/O_2$ gas environment, and, as shown in FIG. 4D, the patterned mask layer 27 is used as a mask and a $Cl_2$, a $Cl_2/CF_2$, and a $Cl_2$ gas environments are used in that sequence in subjecting the upper electrode 26, the ferroelectric layer 25 and the lower electrode 24 to en bloc etching, until the etch stopper 23 is exposed. As shown in FIG. 4E, the exposed etch stopper 23 and the mask layer 27 are removed in the $Cl_2/O_2$ gas environment. As shown in FIG. 4F, alike the en bloc etching of the upper electrode 26, the ferroelectric layer 25 and the lower electrode 24, a portion of each of the upper electrode 26 and the ferroelectric layer 25 is subjected to en bloc etching using a Ru or Cr mask, thereby completing fabrication of the ferroelectric capacitor.

Alike the first embodiment, the method for fabricating a ferroelectric capacitor in accordance with the second embodiment of the present invention has a simple and easy fabrication process even if there are structural steps present under the capacitor, because etch rates of the $RuO_2$ and Ru or Cr used as the etch stopper and the mask layer are very low in etching the upper electrode/ferroelectric layer/the lower electrode in the $Cl_2$, $Cl_{2/CF4}$, and $Cl_2$ gas environment respectively or the upper electrode/the ferroelectric layer in the $Cl_2$ and $Cl_2/CF_4$ gas environment as shown in TABLE 2 below.

TABLE 2

| etching conditions | | | | | | |
|---|---|---|---|---|---|---|
| gas flow (sccm) | RIE power (W)/ICP power (W)/pressure (mTorr) | etch rates (Å/min) | | | | |
| | | Pt | PZT | Ru | CR | $RuO_2$ | Ti |
| $Cl_2$ (50) | 100/700/10 | 350 | | 80 | 120 | 60 | |
| | 200/700/10 | 750 | | 200 | 250 | 150 | |
| $Cl_2/CF_4$ | 100/700/10 | 130 | 400 | 75 | 60 | 55 | |
| (37.5/12.5) | 200/700/10 | 280 | 850 | 190 | 130 | 170 | |
| $Cl_2/O_2$ (30/20) | 100/700/10 | 90 | 25 | | 700 | | 10 |
| $Cl_2/O_2$ (5/45) | 100/700/10 | 85 | 20 | 620 | | 500 | 9 |

TABLE 2 shows etch rates of the etched material and mask material used in the present invention, wherein it can be known that a high etch selectivity (approx. 3~4.4) can be ensured between a Pt thin film and Ru(or Cr) which is a mask material in etching the Pt thin film in a $Cl_2$ gas environment. And, a high etch selectivity (approx. 4.5~6.7) can be ensured between a PZT thin film and Ru(or Cr) which is a mask material in etching the PZT thin film in a $Cl_2/CF_4$ gas environment The high etch selectivity is available in using the Ru or Cr as the etch mask because Ru and Cr do not produce volatile etch by-products if no oxygen is involved. Therefore, in the etching of Ru and Cr, a mask which will not be etched by oxygen is required. As photoresist can be etched by oxygen with easy, in the present invention, Ti is used instead, which is almost not etched in the $Cl_2/O_2$ gas environment in etching the Ru and the Cr, resulting to ensure an etch selectivity as high as 62~70, and it is known that Ti is a good mask material for etching Ru and Cr.

Figure 5A:
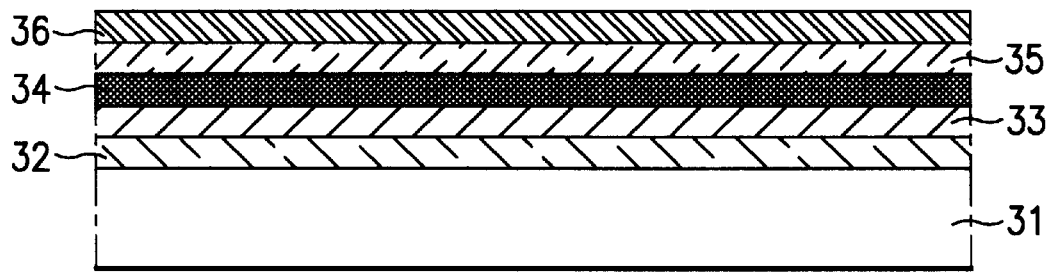
FIGS. 5A~5C illustrate sections showing the steps of a method for fabricating a ferroelectric capacitor in accordance with a third preferred embodiment of the present invention.
Figure 5B:
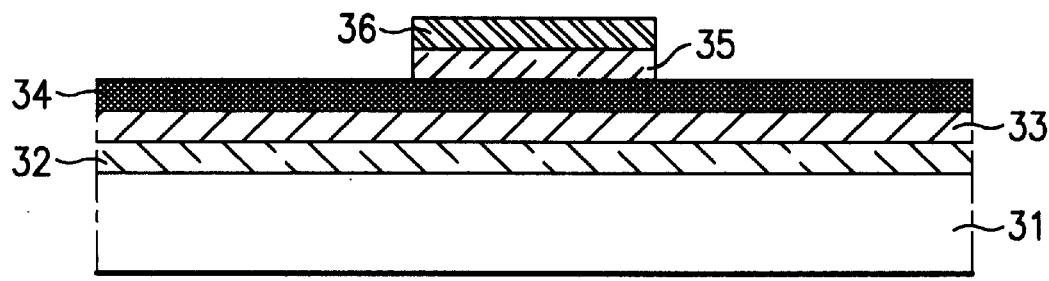
Figure 5C:
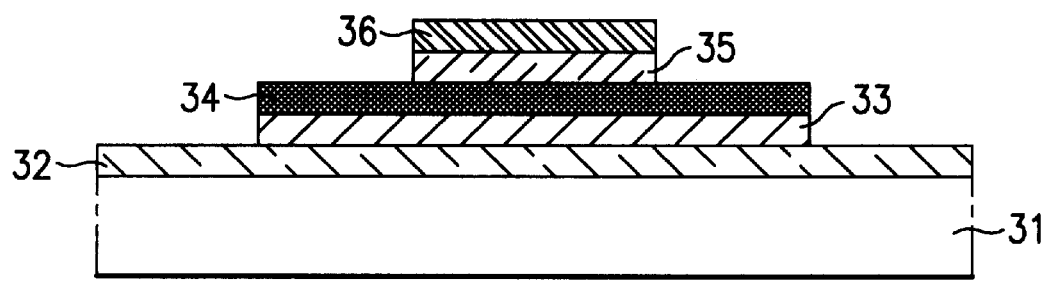

In the meantime, in the first and second embodiments of the present invention, though the upper electrode/the ferroelectric layer are en bloc etched after the upper electrode/the ferroelectric layer/the lower electrode are en bloc etched, the upper electrode/the ferroelectric layer may be en bloc etched in advance before only the lower electrode is etched. That is, as shown in FIG. 5A, a silicon oxide film 32, an etch stopper 33, a lower electrode 34, a ferroelectric layer 35, an upper electrode 36 are formed in succession on the substrate 31, and, as shown in FIG. 5B, an etch mask(not shown) is used in en bloc etching of the upper electrode 36 and the ferroelectric layer 35. Then, as shown in FIG. 5C, the etch mask is used again in etching the lower electrode 34, and the etch mask and the etch stopper layer 33 are removed, thereby completing fabrication of the ferroelectric capacitor. Etch conditions used in this case is the same with the first and second embodiments.

As another embodiment of the present invention, the en bloc etching may be simply carried out only with an etch mask of Ti, Ru and Cr without an etch stopper in the fabrication of the capacitor That is, in a case when a ferroelectric capacitor is formed on a planarized substrate, a capacitor can be fabricated only with the etch mask, but without the etch stopper. In the related art, etching of the ferroelectric layer is difficult due to the steps of the field oxide and the polysilicon. Therefore, the method for fabricating a ferroelectric capacitor of the present invention introduces the etch stopper for planarizing the substrate, which allows an easy etching of the ferroelectric layer. However, if the ferroelectric capacitor is fabricated on a planarized substrate, the etch stopper is not necessarily required. Since the etch masks of Ti, Ru or Cr introduced in the present invention have an excellent etch selectivity and prevents formation of a fence, the etch mask allows fabrication of the capacitor easier compared to conventional etch mask such as PR or $SiO_2$.

Figure 6:
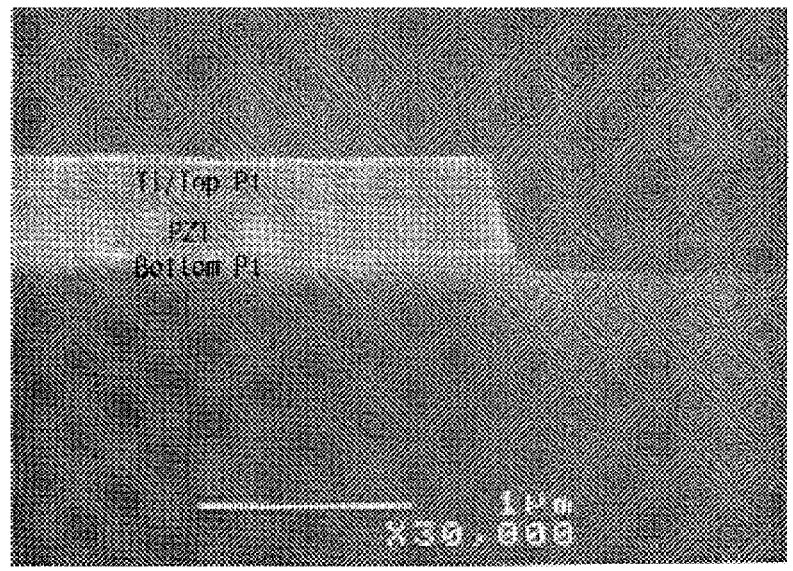
FIG. 6 illustrates a photograph showing cross-section after en bloc etching of an upper electrode/a ferroelectric layer/a lower electrode of the present invention; and, FIG. 7 illustrates a photograph showing surface image after en bloc etching of an upper electrode/a ferroelectric layer/a lower electrode in a sample with steps in view of topology.

FIG. 6 illustrates a photograph showing cross-section after en bloc etching of an upper electrode/a ferroelectric layer/a lower electrode of the present invention, wherefrom it can be known that no residue is formed after etching and no fence is formed due to redeposition of Pt electrode. A etch slop of 70° is shown after the etching, which etch characteristics is considered as a dry etching process applicable to fabrication of an Fe-RAM capacitor of a high device packing density over one giga bits.

Figure 7:
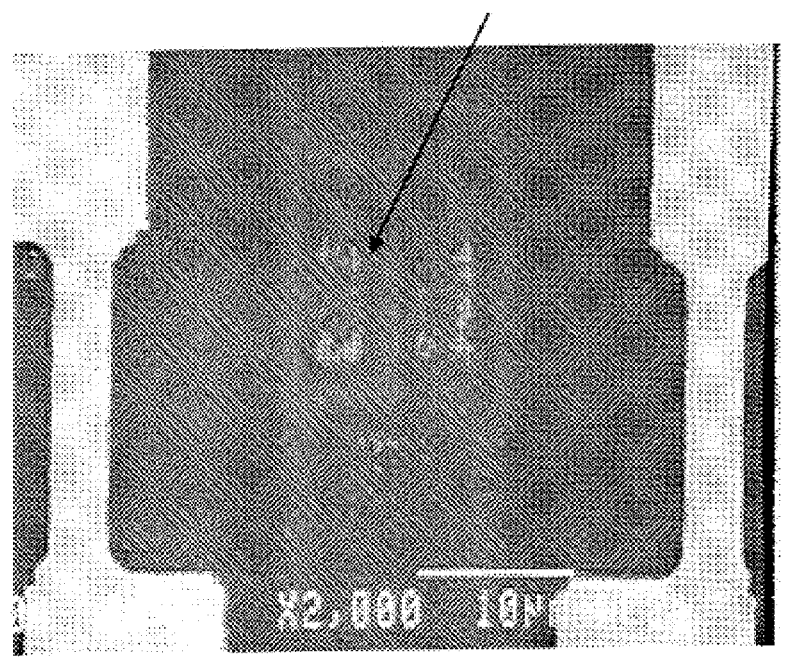

FIG. 7 illustrates a photograph showing surface image after en bloc etching of an upper electrode/a ferroelectric layer/a lower electrode in a sample with steps in view of topology, wherefrom it can be known that residue of the lower electrode remained with a deep groove if there is no etch stopper. And, it seems that the granular residue is caused by faster etching of PZT films along grain boundaries. Such residue can be removed clearly as an adequate overetching is permitted if the etch stopper is used.

The method for fabricating a ferroelectric capacitor of the present invention has the following advantages.

First, as en bloc etching of the upper electrode/the ferroelectric layer/the lower electrode or the upper electrode/the ferroelectric layer is facilitated using a mask with an excellent etch selectivity, the method for fabricating a ferroelectric capacitor has a simple fabrication process and can prevent formation of a fence or etch by-products.

Second, the use of etch stopper in the dry etching facilitates each fabrication of a ferroelectric capacitor regardless of presence of structural steps.

It will be apparent to those skilled in the art that various modifications and variations can be made in the method for fabricating a ferroelectric capacitor of the present invention without departing from the spirit or scope of the invention. Thus, it is intended that the present invention cover the modifications and variations of this invention provided they come within the scope of the appended claims and their equivalents.

What is claimed is:

1. A method for fabricating a ferroelectric capacitor, comprising:
    (1) forming an etch stopper layer formed of $RuO_2$, a lower electrode, a ferroelectric layer, an upper electrode, and an etch mask layer formed of Ru in succession on a substrate;
    (2) patterning the etch mask layer;
    (3) using the etch mask layer as a mask in etching the upper electrode, the ferroelectric layer, and the lower electrode, to expose the etch stopper layer; and,
    (4) removing the exposed portions of the etch stopper layer and the etch mask layer.

2. A method as claimed in claim 1, wherein each of the etch mask layer and the etch stopper layer is formed to a thickness that is based on a combined thickness of the lower electrode, the ferroelectric layer and the upper electrode.

3. A method as claimed in claim 1, wherein the step (2) is conducted by photolithography.

4. A method as claimed in claim 1, wherein the etching in the step (3) is conducted in $Cl_2$, $Cl_2/CF_4$, and a $Cl_2$, gas environments in a sequence in etching the upper electrode, the ferroelectric layer, and the lower electrode, respectively.

5. A method as claimed in claim 1, wherein the step (4) includes the steps of:
    (4-1) removing the etch mask layer, and forming a second etch mask layer formed of Ru on the upper electrode,
    (4-2) patterning the second etch mask layer to a required form, and
    (4-3) using the patterned second etch mask layer as a mask in etching the upper electrode and the ferroelectric layer.

6. A method as claimed in claim 5, wherein the etching in the step (4-3) is conducted in $Cl_2$ and $Cl_2/CF_4$ gas environments in a sequence in etching the upper electrode and the ferroelectric layer, respectively.

7. A method as claimed in claim 1, wherein a silicon oxide film is formed between the substrate and the etch stopper layer.

8. A method as claimed in claim 1, wherein the upper electrode, the ferroelectric layer, the lower electrode, and the etch stopper layer are etched by an ICP (Inductively Coupled Plasma) etcher in steps (3) and (4).

9. A method as claimed in claim 1, wherein the mask layer is removed by $SC1(H_2O_2:NH_4OH:H_2O=1:1:5)$ in step (4).

10. A method as claimed in claim 1, wherein step (4) is conducted in a $Cl_2/O_2$ gas environment.

11. The method as claimed in claim 1, further comprising:
    forming a layer of Ti on the etch mask layer; and
    patterning the Ti layer, wherein the step of patterning the etch mask layer comprises etching the etch mask layer in a $Cl_2/O_2$ gas environment using the patterned Ti layer as a mask.

12. A method for fabricating a ferroelectric capacitor, comprising the steps of:
    (1) forming an etch stopper layer formed of $RuO_2$, a lower electrode, a ferroelectric layer, an upper electrode, and a first etch mask layer formed of Ru in succession on a substrate;
    (2) patterning the first etch mask layer;
    (3) using the first etch mask layer as a mask in etching the upper electrode, and the ferroelectric layer;

(4) removing the first etch mask layer, and forming a second etch mask layer formed of Ru on the upper electrode;
(5) patterning the second etch mask;
(6) using the patterned second etch mask layer as a mask in etching the lower electrode to expose the etch stopper layer, and;
(7) removing the exposed etch stopper layer and the second etch mask layer.

13. A method as claimed in claim 12, wherein the etching in the step (3) is conducted in $Cl_2$ and $Cl_2/CF_4$ gas environments in a sequence, and the etching in the step (6) is conducted in a $Cl_2/O_2$ gas environment or a $Cl_2$ gas environment.

14. A method as claimed in claim 12, wherein a silicon oxide film is formed between the substrate and the etch stopper layer.

* * * * *